(12) United States Patent
Ishikawa et al.

(10) Patent No.: US 7,176,741 B2
(45) Date of Patent: Feb. 13, 2007

(54) LEVEL SHIFT CIRCUIT

(75) Inventors: Tomoya Ishikawa, Osaka (JP);
Hirofumi Nakagawa, Kyoto (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 11/261,518

(22) Filed: Oct. 31, 2005

(65) Prior Publication Data

US 2006/0033550 A1    Feb. 16, 2006

Related U.S. Application Data

(63) Continuation of application No. 10/796,060, filed on Mar. 10, 2004, now abandoned.

(30) Foreign Application Priority Data

May 15, 2003    (JP) .............................. 2003-137124

(51) Int. Cl.
*H03L 5/00*    (2006.01)
(52) U.S. Cl. ........................................ 327/333; 326/81
(58) Field of Classification Search ................ 327/333; 326/68, 81
See application file for complete search history.

(56) References Cited

U.S. PATENT DOCUMENTS

| | | | |
|---|---|---|---|
| 5,444,396 A | 8/1995 | Soneda ........................ | 326/81 |
| 6,239,624 B1 * | 5/2001 | Yang et al. ..................... | 327/55 |
| 6,373,285 B1 | 4/2002 | Konishi ......................... | 326/81 |
| 6,504,400 B2 | 1/2003 | Tanaka et al. ................. | 326/68 |
| 6,507,224 B1 | 1/2003 | Lee et al. ...................... | 327/57 |
| 6,667,648 B2 | 12/2003 | Stout et al. ................... | 327/333 |
| 6,768,368 B2 * | 7/2004 | Kaneko et al. ............... | 327/333 |
| 6,842,045 B2 * | 1/2005 | Shimazaki et al. ........... | 326/81 |
| 2003/0132778 A1 | 7/2003 | Gion ............................. | 326/80 |

FOREIGN PATENT DOCUMENTS

| | | |
|---|---|---|
| JP | 08-079053 | 3/1996 |
| JP | 11-136120 | 5/1999 |
| JP | 2002-217708 | 8/2002 |

\* cited by examiner

*Primary Examiner*—Long Nguyen
(74) *Attorney, Agent, or Firm*—McDermott Will & Emery LLP

(57) ABSTRACT

To a level shift basic circuit having a CMOS configuration and composed of four transistors M1 through M4, a control circuit for preventing feed-through current through the transistors is added. Transitions of complementary data inputs Vin1 and Vin2 are made in a period in which n-MOS transistors M7 and M8 for control are turned OFF by changing a control input VS1 to an L level (switch-off period). In this switch-off period, each source of the n-MOS transistors M1 and M2 is disconnected from VSS. In addition, in the switch-off period, a control input VS2 is changed to an L level, thereby turning ON p-MOS transistors M5 and M6 for control. In a period in which the control p-MOS transistors M5 and M6 are ON, data outputs Vout1 and Vout2 are both precharged to VDD (precharge period).

4 Claims, 6 Drawing Sheets

LEVEL SHIFT CIRCUIT

RELATED APPLICATIONS

This application is a continuation of application Ser. No. 10/796,060, filed Mar. 10, 2004, now abandoned, which claims priority of Japanese Application No. 2003-137124, filed May 15, 2003, the contents of which are hereby incorporated by reference.

BACKGROUND OF THE INVENTION

The present invention relates to a level shift circuit functioning as an interface between circuits operating at different power supply voltages.

In a conventional level shift circuit having a CMOS configuration, a p-MOS transistor and an n-MOS transistor connected in series and interposed between the power supply and the ground inevitably turn ON at the same time at the transition of a data input and, as a result, feed-through current occurs at this time (see Japanese Laid-Open Publication No. 11-136120).

An LCD driver needs level shift circuits in the number obtained by multiplying the number of outputs by the number of bits. For example, an LCD driver having 8 bits and 384 outputs uses as many as 3072 level shift circuits. An application in which such a large number of level shift circuits are used has a drawback of increased power consumption caused by feed-through current in each of the level shift circuits and also has a drawback of a system malfunction occurring when an increase in the ground potential caused by the feed-through current is output as a noise to the outside of the chip.

SUMMARY OF THE INVENTION

It is therefore an object of the present invention to prevent the occurrence of feed-through current in a level shift circuit having a CMOS configuration.

In order to achieve this object, according to the present invention, adopted is a level shift circuit including: a level shift basic circuit for translating an input signal to an output signal which has a difference of a voltage between a first power supply and a second power supply having a lower voltage than that of the first power supply; and a control circuit including a first circuit for disconnecting a feed-through current path in said level shift basic circuit between the first power supply and the second power supply in response to a first control input, and a second circuit for fixing a voltage of an output node from which the output signal is output in response to a second control input.

The control circuit includes: a first circuit for disconnecting a feed-through current path between the first power supply and the second power supply; and a second circuit for fixing a voltage of the output node while the first circuit disconnects the feed-through current path, and is configured such that the disconnection of the feed-through current path by the first circuit is canceled after the fixing of the voltage by the second circuit has terminated and the input signal transitions while the first circuit disconnects the feed-through current path.

DESCRIPTION OF THE PREFERRED EMBODIMENTS

Hereinafter, embodiments of the present invention will be described with reference to the drawings.

Figure 1:
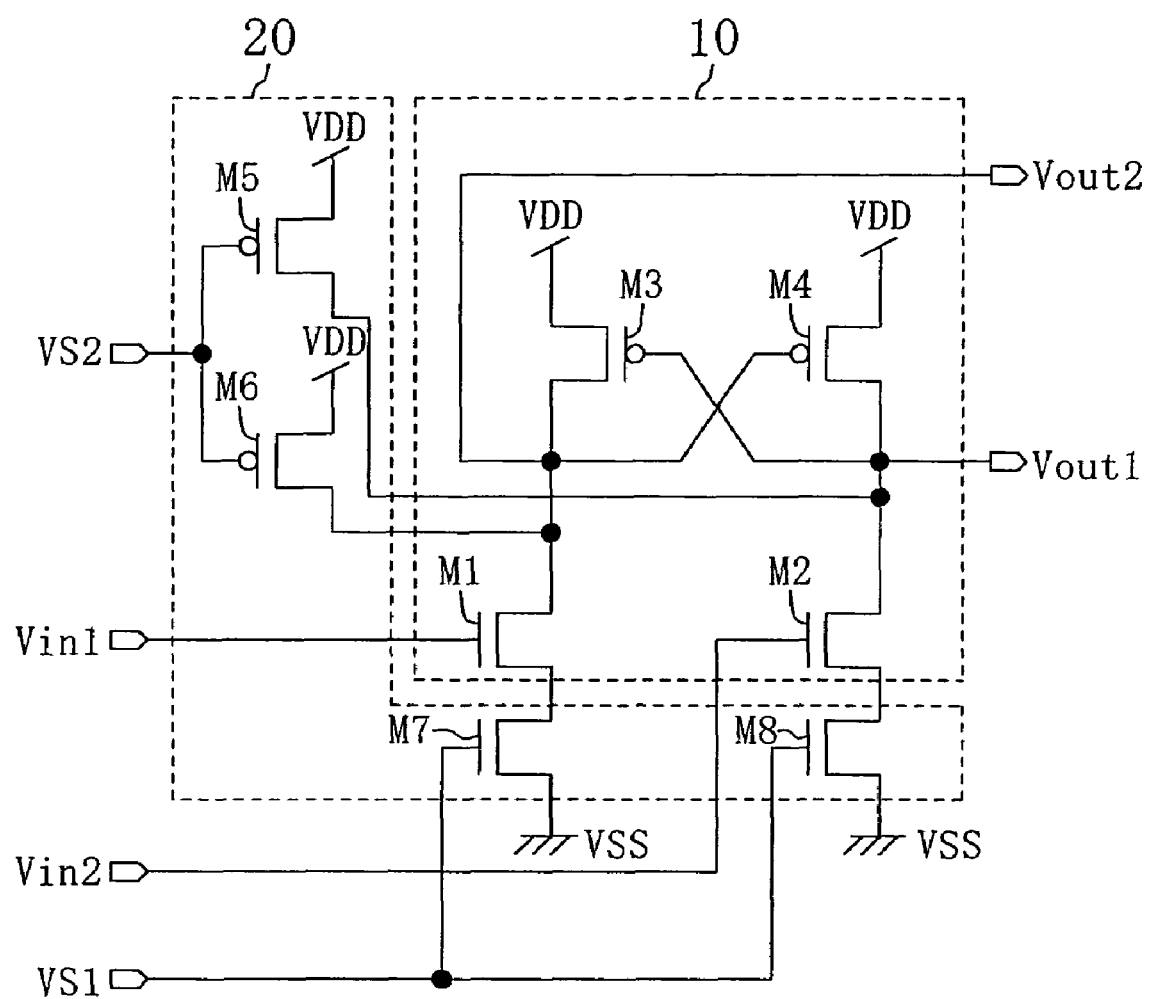
FIG. 1 is a circuit diagram showing an example of a configuration of a level shift circuit according to the present invention.

FIG. 1 shows an example of a configuration of a level shift circuit according to the present invention. In FIG. 1, reference numeral 10 denotes a level shift basic circuit having a CMOS configuration and reference numeral 20 denotes a control circuit for preventing feed-through current. The level shift basic circuit 10 includes two n-MOS transistors M1 and M2 and two p-MOS transistors M3 and M4. The control circuit 20 includes two p-MOS transistors M5 and M6 and two n-MOS transistors M7 and M8. Reference signs Vin1 and Vin2 denote complementary data inputs, reference signs VS1 and VS2 respectively denote control inputs, reference signs Vout1 and Vout2 respectively denote data outputs, reference sign VDD denotes a first power supply, and reference sign VSS denotes a second power supply (ground: 0V) having a voltage lower than VDD.

In FIG. 1, Vin1 and Vin2 are connected to the gates of the n-MOS transistors M1 and M2, respectively. The source of the n-MOS transistor M1 is connected to the drain of the n-MOS transistor M7 whose gate is connected to VS1. The source of the n-MOS transistor M7 is connected to VSS. In the same manner, the source of the n-MOS transistor M2 is connected to the drain of the n-MOS transistor M8 whose gate is connected to VS1. The source of the n-MOS transistor M8 is connected to VSS. The drain of the n-MOS transistor M1 is connected to the drain of the p-MOS transistor M3. The drain of the n-MOS transistor M2 is connected to the drain of the p-MOS transistor M4. The sources of the p-MOS transistors M3 and M4 are respectively connected to VDDs. The gate of the p-MOS transistor M3 is connected to the drain of the p-MOS transistor M4 at a connection point, which will be referred to as a first data output node Vout1. The gate of the p-MOS transistor M4 is connected to the drain of the p-MOS transistor M3 at a connection point, which will be referred to as a second data output node Vout2. The sources of the p-MOS transistors M5 and M6 whose respective gates are connected to VS2 are respectively connected to VDDs. The drain of the p-MOS transistor M5 is connected to Vout1, whereas the drain of the p-MOS transistor M6 is connected to Vout2.

Figure 2:
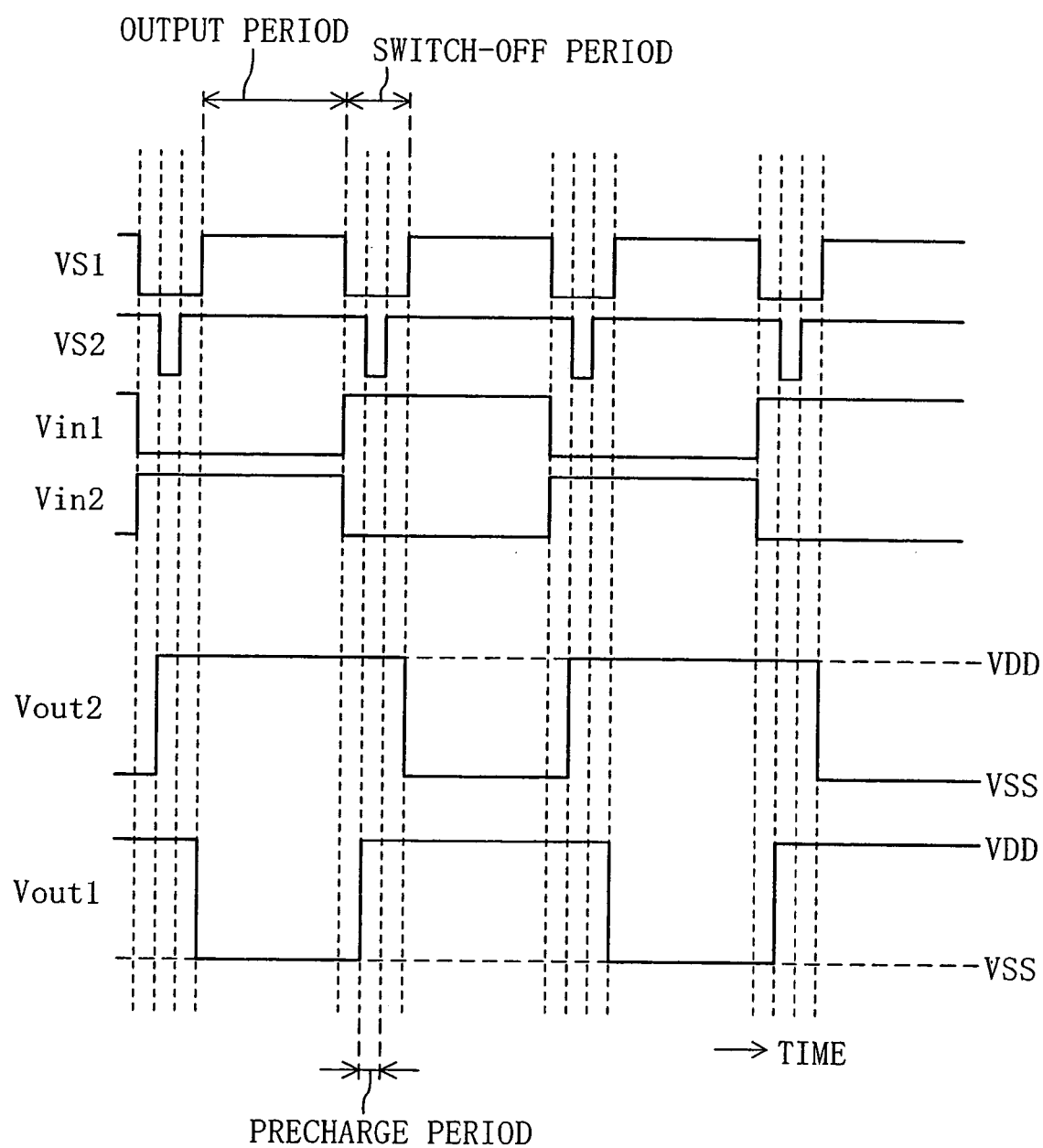
FIG. 2 is a time chart showing an example of operation of the level shift circuit shown in FIG. 1.

FIG. 2 shows an example of operation of the level shift circuit shown in FIG. 1. First, as an initial state, VS1 and VS2 are at H levels, Vin1 is at an L level and Vin2 is at an H level. In this state (output period), Vout1 outputs VSS and Vout2 outputs VDD. Since the n-MOS transistor M1 and the p-MOS transistor M4 are OFF, no feed-through current flows between VDDs and VSSs.

Next, to switch the level shift outputs, the transitions of Vin1 and Vin2 are made in a period in which the n-MOS transistors M7 and M8 for control are turned OFF by changing VS1 to an L level (switch-off period). During this switch-off period, the sources of the n-MOS transistors M1 and M2 are respectively disconnected from VSSs. In addition, in the switch-off period, VS2 is changed to an L level so that the p-MOS transistors M5 and M6 for control turn ON. While the control p-MOS transistors M5 and M6 are ON, Vout1 and Vout2 are both precharged to VDD (precharge period). Accordingly, Vout1 transitions from VSS to VDD at the beginning of the precharge period.

In the example shown in FIG. 2, after Vin1 and Vin2 transition from the L level to the H level and from the H level to the L level, respectively, and then the precharge period terminates by returning VS2 to the H level, Vout2 transitions from VDD to VSS at the point of time when the disconnections by the n-MOS transistors M7 and MS are canceled by returning VS1 to the H level.

During the switching of the level shift output described above, the n-MOS transistor M1 and the p-MOS transistor M3 do not turn ON at the same time, and the n-MOS transistor M2 and the p-MOS transistor M4 also do not turn ON at the same time. Accordingly, no feed-through current flows through these transistors. While Vout1 and Vout2 output VDD due to turning ON of the control p-MOS transistors M5 and M6, the sources of the n-MOS transistors M1 and M2 are respectively disconnected from VSSs by the control n-MOS transistors M7 and M8. As a result, no feed-through current flows through the control p-MOS transistors M5 and M6.

Assuming that the level shift circuit shown in FIG. 1 does not include the control circuit 20, when Vin1 and Vin2 transition from the L level to the H level and from the H level to the L level, respectively, the n-MOS transistor M1 changes from the OFF-state to the ON-state and the n-MOS transistor M2 changes from the ON-state to the OFF-state. In this case, both the n-MOS transistor M1 and the p-MOS transistor M3 are ON, so that feed-through current occurs between VDDs and VSSs. To prevent this feed-through current, conventionally, the current driving capability (gate width) of the n-MOS transistor M1 in the ON-state has been designed higher than that of the p-MOS transistor M3 such that the potential of Vout2 is gradually reduced by the n-MOS transistor M1 and eventually the feed-through current is shut off. In the same manner, the current driving capability (gate width) of the n-MOS transistor M2 in the ON-state has been designed higher than that of the p-MOS transistor M4. On the other hand, in the level shift circuit shown in FIG. 1 and provided with the control circuit 20 for preventing feed-through current, it is unnecessary for the n-MOS transistors M1 and M2 to shut off the feed-through current. Therefore, the current driving capabilities (gate widths) of the n-MOS transistors M1 and M2 are not necessarily higher than those of the p-MOS transistors M3 and M4. Accordingly, the circuit area of the level shift basic circuit 10 can be reduced.

In FIG. 1, the level shift circuit is configured such that Vout1 and Vout2 are fixed at VDD by the p-MOS transistors M5 and M6 in accordance with VS2. Alternatively, Vout1 and Vout2 may be fixed at VSS in accordance with the polarity of a required output node. However, the fixing at VDD has the advantage of smaller size of the n-MOS transistors M1 and M2 because the p-MOS transistors M3 and M4 are OFF both at the falling edge of Vout1 and at the falling edge of Vout2.

In addition, the control n-MOS transistors M7 and M8 shown in FIG. 1 may be replaced with one n-MOS transistor. However, in terms of a layout, the two n-MOS transistors M7 and M8 are preferably adopted.

Figure 3:
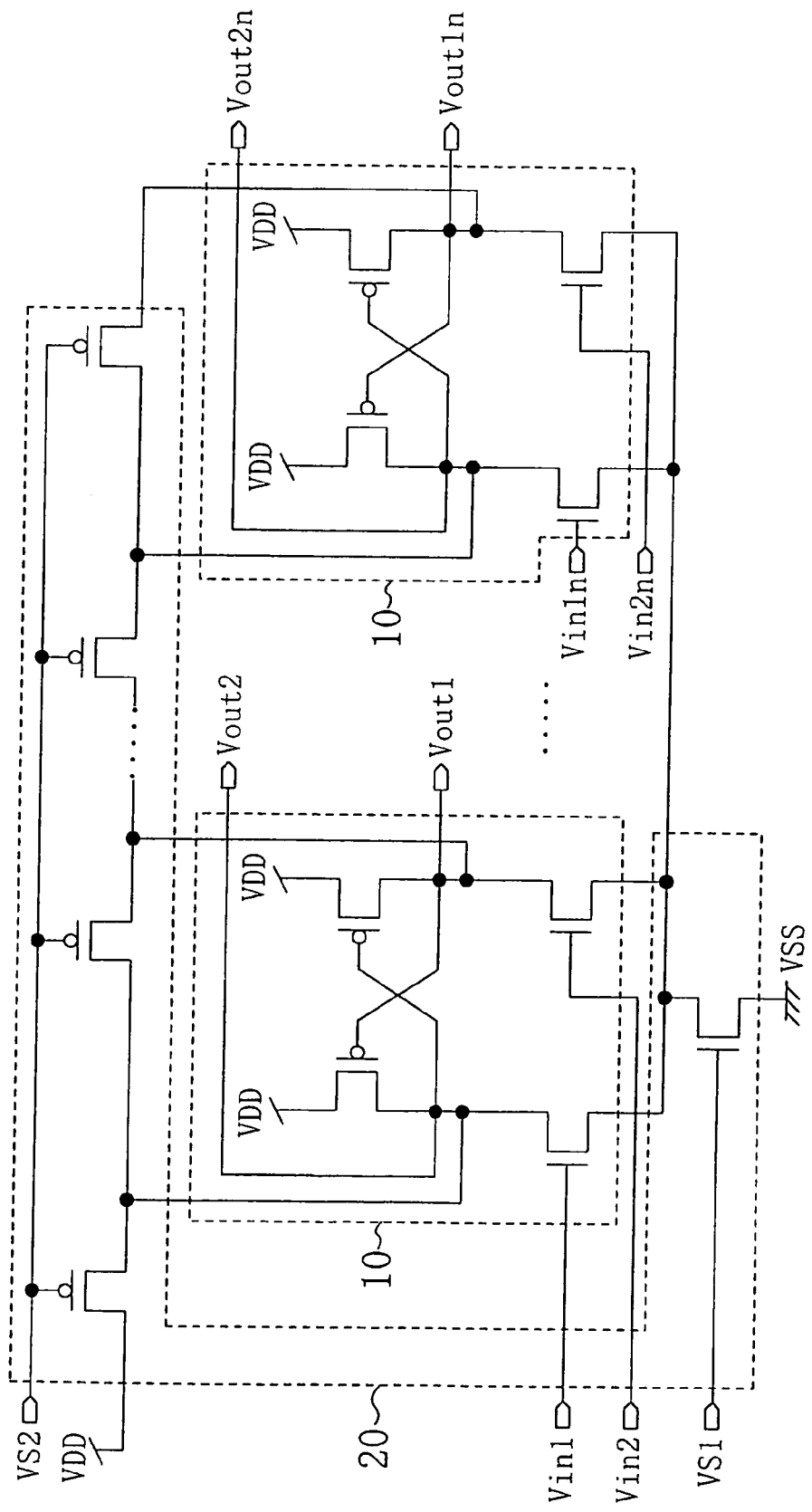
FIG. 3 is a circuit diagram showing a modified example of the level shift circuit shown in FIG. 1.

FIG. 3 shows a modified example of the level shift circuit shown in FIG. 1. In FIG. 3, one control circuit 20 for preventing feed-through current is provided for n level shift basic circuits 10 where n is an integer of two or more. Then, the area penalty due to provision of the control circuit 20 can be reduced.

Figure 4:
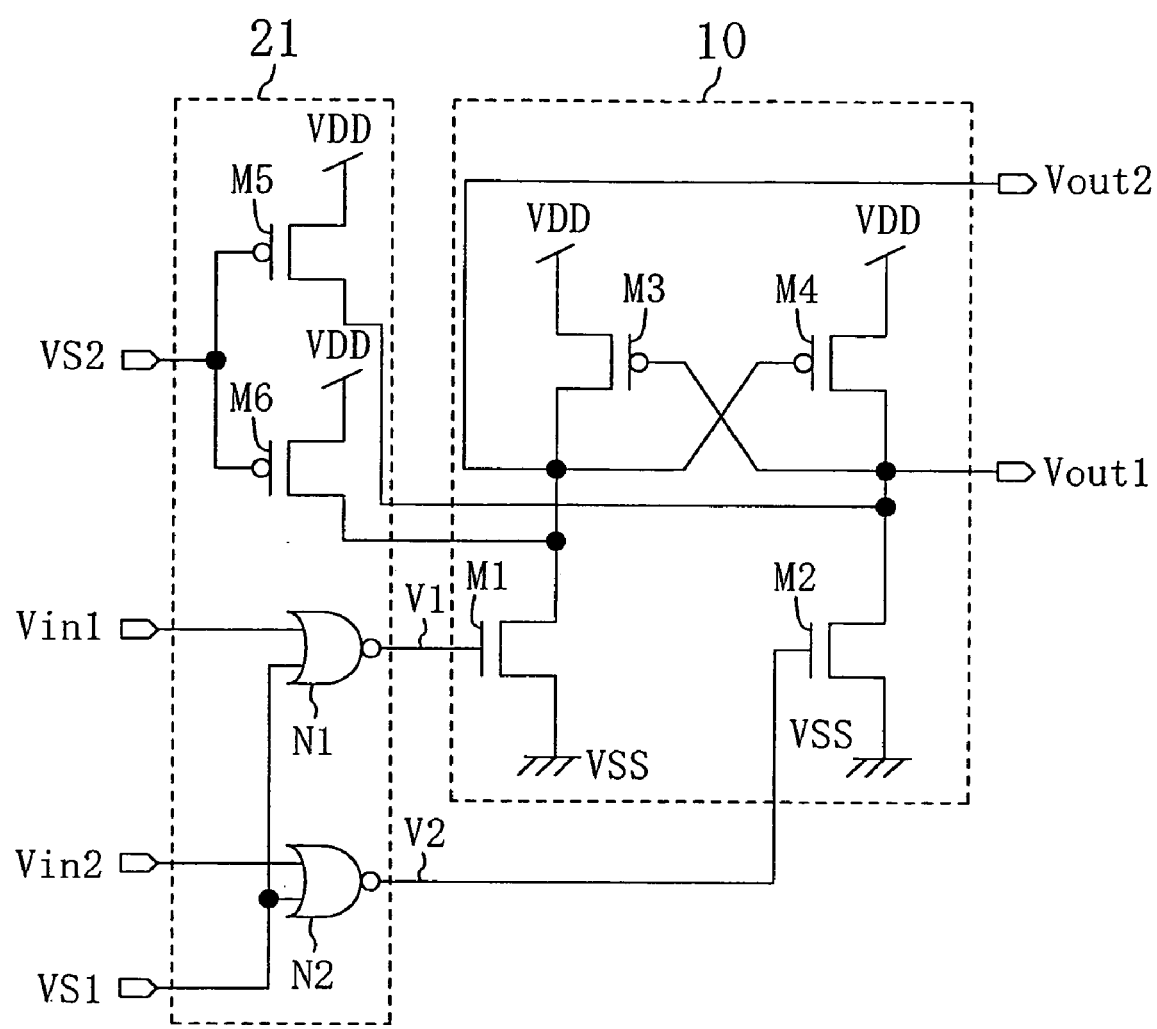
FIG. 4 is a circuit diagram showing another example of the configuration of the level shift circuit of the present invention.

FIG. 4 shows another example of the configuration of the level shift circuit of the present invention. In FIG. 4, reference numeral 10 denotes a level shift basic circuit having a CMOS configuration, and reference numeral 21 denotes a control circuit for preventing feed-through current. The level shift basic circuit 10 includes two n-MOS transistors M1 and M2 and two p-MOS transistors M3 and M4. The control circuit 21 includes two two-input NOR circuits N1 and N2 and two p-MOS transistors M5 and M6. Reference signs Vin1 and Vin2 denote complementary data inputs, reference signs VS1 and VS2 respectively denote control inputs, reference signs Vout1 and Vout2 respectively denote data outputs, reference sign VDD denotes a first power supply, and reference sign VSS denotes a second power supply (ground: 0V) having a voltage lower than VDD.

In FIG. 4, the NOR circuit N1 receives Vin1 and VS1, and the NOR circuit N2 receives Vin2 and VS1. The gate of the n-MOS transistor M1 is connected to an output V1 of the NOR circuit N1, and the gate of the n-MOS transistor M2 is connected to an output V2 of the NOR circuit N2. The sources of the n-MOS transistors M1 and M2 are respectively connected to VSSs. The drain of the n-MOS transistor M1 is connected to the drain of the p-MOS transistor M3, and the drain of the n-MOS transistor M2 is connected to the drain of the p-MOS transistor M4. The sources of the p-MOS transistors M3 and M4 are respectively connected to VDDs. The gate of the p-MOS transistor M3 is connected to the drain of the p-MOS transistor M4 at a connection point, which will be referred to as a first data output node Vout1. The gate of the p-MOS transistor M4 is connected to the drain of the p-MOS transistor M3 at a connection point, which will be referred to as a second data output node Vout2. The sources of the p-MOS transistors M5 and M6 whose respective gates are connected to VS2 are respectively connected to VDDs. The drain of the p-MOS transistor M5 is connected to Vout1, whereas the drain of the p-MOS transistor M6 is connected to Vout2.

Figure 5:
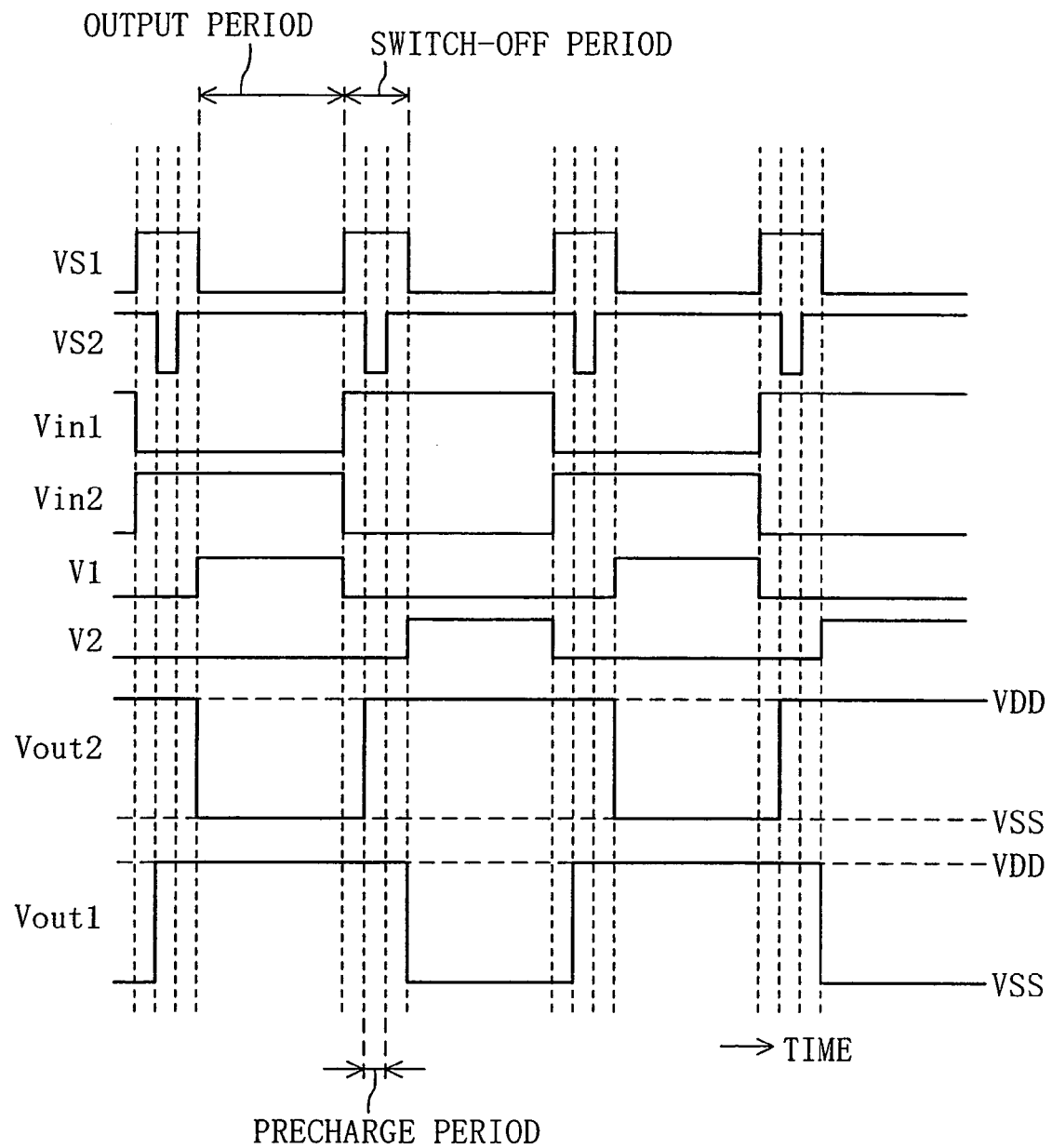
FIG. 5 is a time chart showing an example of operation of the level shift circuit shown in FIG. 4.

FIG. 5 shows an example of operation of the level shift circuit shown in FIG. 4. First, as an initial state, VS1 is at an L level, VS2 is at an H level, Vin1 is at an L level and Vin2 is at an H level. In this state (output period), V1 is at an H level, V2 is at an L level, Vout1 outputs VDD and Vout2 outputs VSS. Since the n-MOS transistor M2 and the p-MOS transistor M3 are OFF, no feed-through current flows between VDDs and VSSs.

Next, to switch the level shift outputs, transitions of Vin1 and Vin2 are made in a period in which VS1 is changed to an H level and thereby the gate voltages V1 and V2 of the n-MOS transistors M1 and M2 are reduced to L levels so that the n-MOS transistors M1 and M2 are forced to turn OFF (switch-off period). In addition, in this switch-off period, VS2 is changed to an L level so that the p-MOS transistors M5 and M6 for control turn ON. In a period during which the control p-MOS transistors M5 and M6 are ON, both Vout1 and Vout2 are precharged to VDD (precharge period). Accordingly, Vout2 transitions from VSS to VDD at the beginning of the precharge period.

In the example shown in FIG. 5, after Vin1 and Vin2 transition from the L level to the H level and from the H level to the L level, respectively, and then the precharge period terminates by returning VS2 to the H level, V2 transitions from the L level to the H level and Vout1 transitions from VDD to VSS at the point of time when the forced OFF-states of the n-MOS transistors M1 and M2 are canceled by returning VS1 to the L level.

During the switching of the level shift output described above, the n-MOS transistor M1 and the p-MOS transistor M3 do not turn ON at the same time, and the n-MOS transistor M2 and the p-MOS transistor M4 also do not turn ON at the same time. Accordingly, no feed-through current flows through these transistors. While turning ON of the control p-MOS transistors MS and M6 makes Vout1 and Vout2 output VDD, the n-MOS transistors M1 and M2 are in the forced OFF-states. Accordingly, no feed-through current flows through the control p-MOS transistors M5 and M6.

In the level shift circuit shown in FIG. 4 and provided with the control circuit 21 for preventing feed-through current, also, the current driving capabilities (gate widths) of the n-MOS transistors M1 and M2 are not necessarily higher than those of the p-MOS transistors M3 and M4, either. Accordingly, the circuit area of the level shift basic circuit 10 can be reduced.

Figure 6:
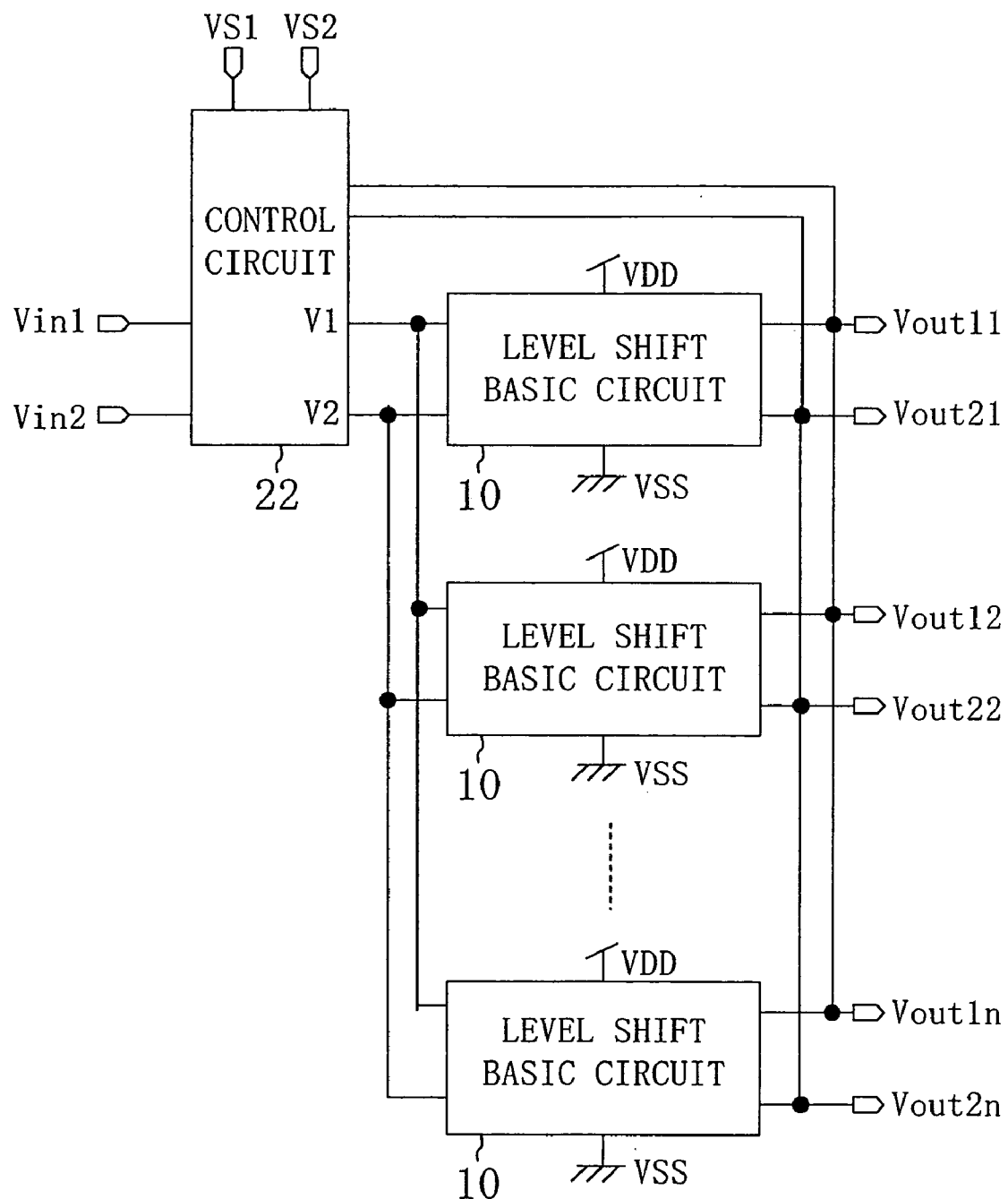
FIG. 6 is a block diagram showing a modified example of the level shift circuit shown in FIG. 4.

FIG. 6 shows a modified example of the level shift circuit shown in FIG. 4. In FIG. 6, one control circuit 22 for preventing feed-through current is provided for n level shift basic circuits 10 where n is an integer of two or more. Then, the area penalty due to provision of the control circuit 22 can be reduced.

Inverters may be appropriately added to an output stage of the level shift basic circuit 10 in the above embodiments depending on whether the subsequent circuit is a p-channel type or an n-channel type. In the above description, the second power supply is VSS (=0V), but may be changed to a positive or negative power supply.

As described above, according to the present invention, it is possible to prevent the occurrence of feed-through current in a level shift circuit having a CMOS configuration. The inventive level shift circuit is useful as a level shift circuit functioning as an interface between circuits operating at different power supply voltages.

What is claimed is:

1. A level shift circuit comprising:
   a plurality of level shift basic circuits each for receiving a first power supply and each electrically connected to a common node;
   wherein a first level shift basic circuit of the plurality of level shift basic circuits includes:
      a first transistor of a first conductivity type for receiving the first power supply, wherein a drain thereof is electrically connected to a first node and a gate electrode thereof is electrically connected to a second node;
      a second transistor of the first conductivity type for receiving the first power supply, wherein a drain thereof is electrically connected to the second node and a gate electrode thereof is electrically connected to the first node;
      a third transistor of a second conductivity type, interposed between the first node and the common node, and having a gate electrode being controlled in response to a first input signal;
      a fourth transistor of the second conductivity type, interposed between the second node and the common node, and having a gate electrode being controlled in response to a second input signal; and
      a first output node for transmitting a first output voltage in response to a voltage of one of the first node and the second node, and
   wherein a second level shift basic circuit of the plurality of level shift basic circuits includes:
      a fifth transistor of the first conductivity type for receiving the first power supply, wherein a drain thereof is electrically connected to a third node and a gate electrode thereof is electrically connected to a fourth node;
      a sixth transistor of the first conductivity type for receiving the first power supply, wherein a drain thereof is electrically connected to the fourth node and a gate electrode thereof is electrically connected to the third node;
      a seventh transistor of the second conductivity type, interposed between the third node and the common node, and having a gate electrode being controlled in response to a third input signal;
      an eighth transistor of the second conductivity type, interposed between the fourth node and the common node, and having a gate electrode being controlled in response to a fourth input signal; and
      a second output node for transmitting a second output voltage in response to a voltage of one of the third node and the fourth node, and
   a connecting transistor of the second conductivity type for receiving a second power supply, wherein a drain thereof is electrically connected to the common node, and a gate electrode thereof is controlled in response to a first control input signal; and
   a voltage fixing circuit for fixing each of the first, second, third and fourth nodes to a predetermined voltage in response to a second control input signal.

2. The level shift circuit of claim 1, wherein the voltage fixing circuit electrically fixes each of the first, second, third and fourth nodes to the first power supply in response to the second control input signal.

3. The level shift circuit of claim 1, wherein the first control input signal is controlled so that the connecting transistor is turned OFF while the first and second input signals are changed.

4. The level shift circuit of claim 3, wherein the second control input signal is controlled so that the voltage fixing circuit electrically fixes each of the first, second, third and fourth nodes to the predetermined voltage while the first control input signal is controlled so that the connecting transistor is turned OFF.

* * * * *